US008933482B2

(12) United States Patent
Miyata

(10) Patent No.: US 8,933,482 B2
(45) Date of Patent: Jan. 13, 2015

(54) LIGHT EMITTING DEVICE

(71) Applicant: Nichia Corporation, Anan-shi, Tokushima (JP)

(72) Inventor: Tadaaki Miyata, Yokohama (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/867,220

(22) Filed: Apr. 22, 2013

(65) Prior Publication Data
US 2013/0277707 A1  Oct. 24, 2013

(30) Foreign Application Priority Data

Apr. 23, 2012 (JP) ................................. 2012-097685
Mar. 15, 2013 (JP) ................................. 2013-053857

(51) Int. Cl.
*H01L 21/44* (2006.01)
*H01L 33/62* (2010.01)
*H01L 33/00* (2010.01)
*H01L 23/00* (2006.01)

(52) U.S. Cl.
CPC ............ *H01L 33/62* (2013.01); *H01L 33/0095* (2013.01); *H01L 24/32* (2013.01); *H01L 2933/0066* (2013.01); *H01L 2924/07811* (2013.01)
USPC .............................. 257/100; 257/99; 257/789

(58) Field of Classification Search
CPC .................................. H01L 33/56; H01L 33/52
USPC ........ 257/13, 81, 100, 184, 432, 778, 789, 99
See application file for complete search history.

(56) References Cited

U.S. PATENT DOCUMENTS 8,007,627 B2 *  8/2011  Nishida et al. ............. 156/306.6
2007/0126356 A1  6/2007  Tanda et al.
2014/0001419 A1 *  1/2014  Namiki et al. ................ 252/513

FOREIGN PATENT DOCUMENTS

JP       2007-157940        6/2007

* cited by examiner

*Primary Examiner* — Quoc Hoang
(74) *Attorney, Agent, or Firm* — Antonelli, Terry, Stout & Kraus, LLP.

(57) ABSTRACT

A light-emitting device having superior light extraction efficiency and method for producing a light emitting device are provided. A light emitting device includes a base body having wiring conductors, conductive adhesive member, especially an anisotropic conductive adhesive member, including electrically conductive particles mixed in a light transmissive resin, and a semiconductor light emitting element bonded on the wiring conductors via the anisotropic conductive adhesive. The anisotropic conductive adhesive member includes the electrically conductive particles with a concentration lower in a surrounding region around the semiconductor light emitting element than in a lower region located between the semiconductor light emitting element and the base body.

26 Claims, 6 Drawing Sheets

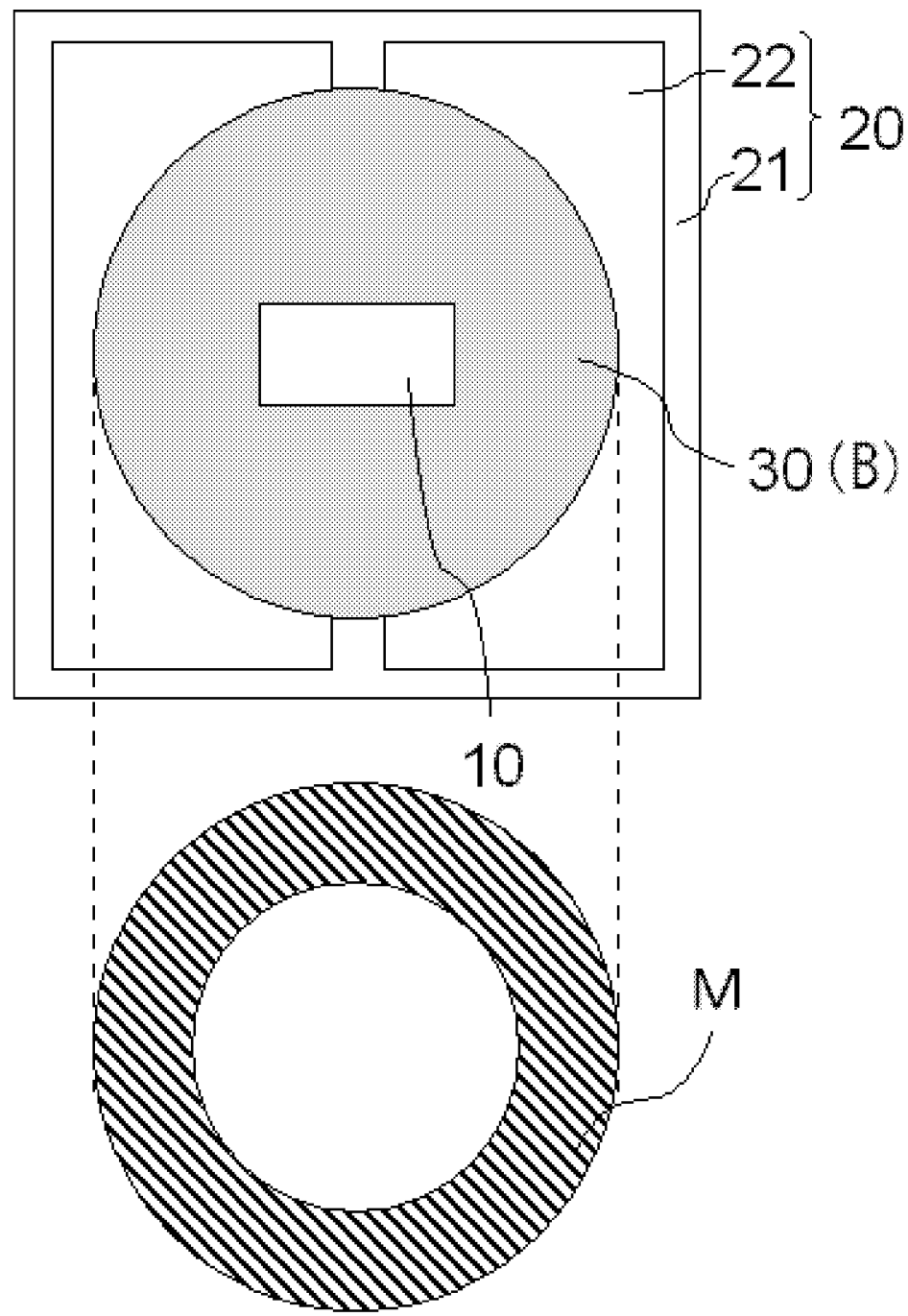

LIGHT EMITTING DEVICE

CROSS-REFERENCE TO RELATED APPLICATIONS

The present application claims priority under 35 U.S.C. §119 to Japanese Patent Application No. 2012-097685, filed Apr. 23, 2012, and Japanese Patent Application No. 2013-053857, filed Mar. 15, 2013. The contents of these applications are incorporated herein by reference in their entireties.

BACKGROUND OF THE INVENTION

1. Field of the Invention

The present disclosure relates to a light emitting device and method for producing a light emitting device.

2. Description of the Related Art

In a light emitting device using a semiconductor light emitting element, a flip-chip mounting, in which electric power is applied (power feeding) to a semiconductor light emitting element without using a wire, is known to be employed. For example, in the case of a GaN-system semiconductor light emitting element in which a nitride semiconductor layer is grown on an insulating sapphire substrate, therein a known method in which a p-electrode and an n-electrode are disposed on the respective semiconductor layers (same plane side), then, the electrodes are placed facing the wiring disposed on a circuit substrate and are bonded to the circuit by using an electrically conductive bonding member to establish electrical continuity. With this method, little of the light from the semiconductor light emitting element is allowed to propagate in the substrate direction, so that the light can be released efficiently from the upper surface and side surfaces directions.

Examples of electrically conductive bonding members for establishing electrical continuity between the substrate and the semiconductor light emitting element include solder bumps and plating bumps, but in the case of a small-size light emitting element, due to a short distance between the p-electrode and the n-electrode, a short circuit tends to occur. Thus, an anisotropic conductive adhesive is used as a bonding member. An anisotropic conductive adhesive is made of electrically conductive particles mixed in a thermosetting resin and a film state (ACF: Anisotropic Conductive Film), and a paste state (ACP: Anisotropic Conductive Paste) are known. In the case where an anisotropic conductive adhesive is applied particularly to a microscopic region, ACP is suitable because it can be disposed with any desired size and position by way of printing. For the electrically conductive particles, metal particles or composite particles obtained by coating the surface of insulating particles with a wiring conductor are used, and in the case where the electrically conductive particles are used for the bonding member of the semiconductor light emitting element, conductive particles having high reflectance are known to be used (for example, see Japanese Patent Publication No. 2007-157940 A).

The anisotropic conductive adhesive not only serves to establish electrical continuity but also functions as a die-bonding member for fixing the semiconductor light emitting element, thus, the anisotropic conductive adhesive is disposed with a larger area than that of the semiconductor light emitting element. Also, the anisotropic conductive adhesive is needed to be disposed with a certain thickness, which may lead to a formation of a fillet which covers at least a part of a side surface of the semiconductor light emitting element. However, in order to obtain uniform electric conductivity, the electrically conductive particles are needed to be uniformly dispersed in an anisotropic conductive adhesive with a certain concentration. Accordingly, many electrically conductive particles present in portions surrounding the semiconductor light emitting element in top view and in the fillet. At least the surfaces of the electrically conductive particles are made of a metal which may result in absorption of some of light emitted from the side surfaces of the semiconductor light emitting element.

SUMMARY OF THE INVENTION

A light emitting device according to an embodiment of the present invention includes a base body having wiring conductors, a conductive adhesive member, especially an anisotropic conductive adhesive member, in which electrically conductive particles are mixed in a light transmissive resin, and a semiconductor light emitting element bonded on the wiring conductors via the anisotropic conductive adhesive member. In the conductive adhesive member, the concentration of the electrically conductive particles in a region surrounding the semiconductor light emitting element is lower than the concentration of the electrically conductive particles in a lower region located between the semiconductor light emitting element and the base body. A method for producing a light emitting device according to an embodiment of the present invention includes the steps of providing a base body having wiring conductors, providing a conductive adhesive member comprising electrically conductive particles substantially uniformly dispersed in a light transmissive resin on at least the wiring conductors of the base body, mounting a semiconductor light emitting element on the wiring conductors via the conductive adhesive, moving the electrically conductive particles in the conductive adhesive member so as to provide the conductive adhesive member with a concentration of the electrically conductive particles lower in a surrounding region around the semiconductor light emitting element than in a lower region located between the semiconductor light emitting element and the base body; and then hardening the light transmissive resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6 is a diagram illustrating a method of manufacturing a light emitting device according to an embodiment.

DETAILED DESCRIPTION OF EMBODIMENTS

Preferred embodiments of the present invention will be described below with reference to the accompanying drawings. The preferred embodiments are intended as illustrative of a light emitting device to give a concrete form to technical ideas of the present invention, and the scope of the invention is not limited to those described below. Particularly, the sizes, materials, shapes and the relative positions of the members described in examples are given as an example and not as a limitation to the scope of the invention unless specifically stated. The sizes and the arrangement relationships of the members in each of drawings are occasionally shown exaggerated for ease of explanation.

Figure 1:
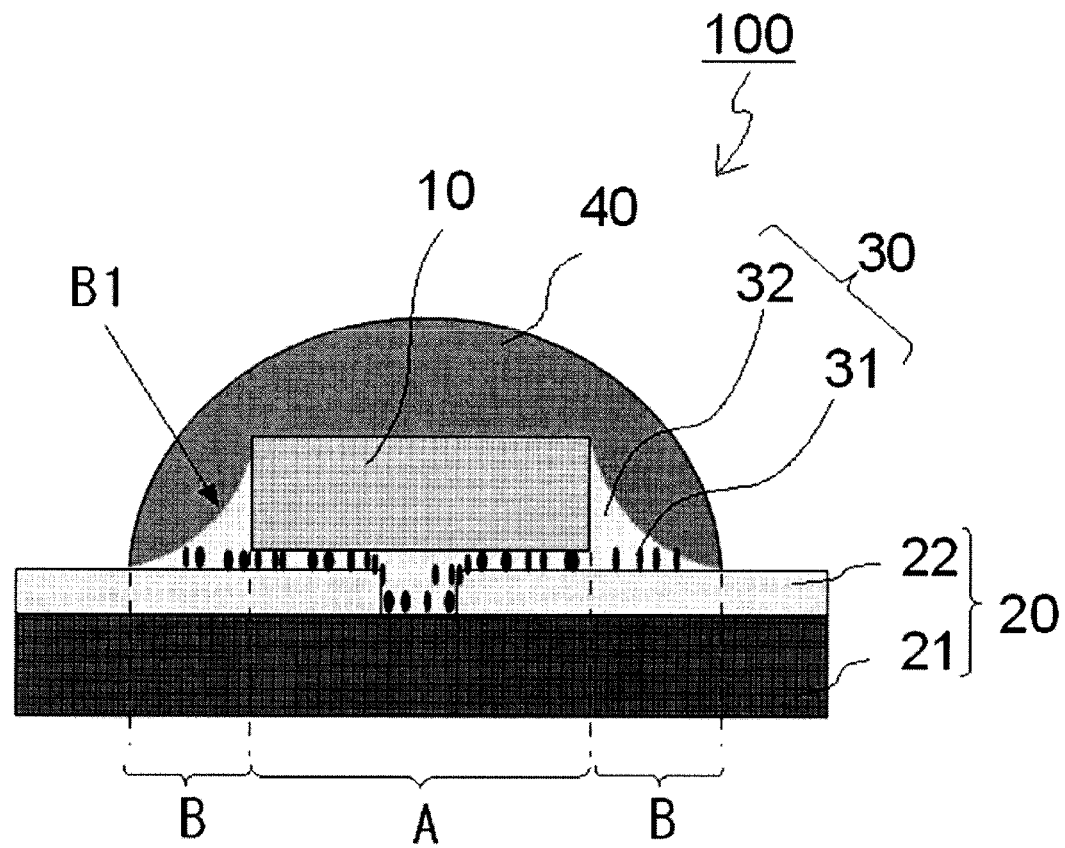
FIG. 1 is a schematic cross sectional view of a light emitting device according to an embodiment.

The light emitting device according to the present embodiment will be described below with reference to FIG. 1 and FIG. 2A to FIG. 2D. FIG. 1 is a cross-sectional view of a light emitting device according to the present embodiment and FIG. 2A to FIG. 2D are diagrams illustrating a method of manufacturing a light emitting device shown in FIG. 1.

As shown in FIG. 1, the light emitting device 100 includes a base body 20 which includes a pair of wiring conductors 22 which function as a pair of positive and negative electrodes, and an insulating parent material 21 which holds the wiring conductors 22, a conductive adhesive member, especially an anisotropic conductive adhesive as shown in this embodiment, 30 made of electrically conductive particles 31 mixed in a light transmissive resin 32, and a semiconductor light emitting element 10 (hereinafter may also be referred to as "light emitting element") bonded on the base body 20 via the anisotropic conductive adhesive 30.

In the anisotropic conductive adhesive member 30, the concentration of the electrically conductive particles in the surrounding region B around the semiconductor light emitting element 10 is lower than the concentration of the electrically conductive particles in the lower region A located between the semiconductor light emitting element 10 and the base body 20. As described above, the electrically conductive particles which tend to absorb light from the light emitting element are unevenly distributed with a higher concentration in the lower region A which requires an electrical continuity. Thus, in the lower region A, absorption of light by the electrically conductive particles in the surrounding region B can be prevented without disrupting electrical continuity between the electrodes of the light emitting element 10 and the corresponding wiring conductors 22 of the base body 20. In the present specification, the terms "lower portion", "upper portion", "upper side" and "lower side" are used in such a way that "lower portion" and "lower side" refer to a side closer to the base body 20 and "upper portion" and "upper side" refer to a side farther from the base body 20, and these terms do not refer to a vertical relationship in use. Further, these terms also refer to positions which are directly above or directly below as well as positions which are not directly above or directly below in a cross-sectional view.

As described above, the anisotropic conductive adhesive member 30 is disposed with a larger area than the area of the light emitting element, and as shown in FIG. 1, the anisotropic conductive adhesive member 30 includes a lower region A which is under the light emitting element 10 and a surrounding region B which is around the light emitting element 10 and at an outer side than the side surfaces of the light emitting element 10. The concentration of the electrically conductive particles 31 in the anisotropic conductive adhesive member 30 is higher in the lower region A than in the surrounding region B. That is, in a direction (lateral direction) in parallel to the upper surface of the base body 20, regions having different concentration of the electrically conductive particles are provided in the anisotropic conductive adhesive member, such as a region having a high concentration (lower region A) and a region having a low distribution concentration (surrounding region B) of the electrically conductive particles. As described above, a large number of the electrically conductive particles that tend to absorb light are arranged under the light emitting element which requires an electrical continuity, and a small number of the electrically conductive particles are arranged in the surrounding region where absorption of light becomes a problem. Thus, absorption of light emitted from the side surfaces of the light emitting element 10 can be reduced and degradation of the light extracting efficiency can be prevented.

Further, the surrounding region B of the anisotropic conductive adhesive member can be formed as a region where electrically conductive particles are not present, that is, as a region formed only with a light transmissive resin, and with this arrangement, absorption of light can be further reduced. In addition, even in the case where the electrically conductive particles present in portions outside of the light emitting element 10, by reducing the concentration of the electrically conductive particles in portions of the surrounding region where absorption of light becomes problematic, absorption of light can be reduced. That is, adjusting the concentration of the conductive particles in the external region to a low concentration at a side closer the light emitting element and a high concentration at a side away from the light emitting element allows reduction of the absorption of light.

Figure 4:
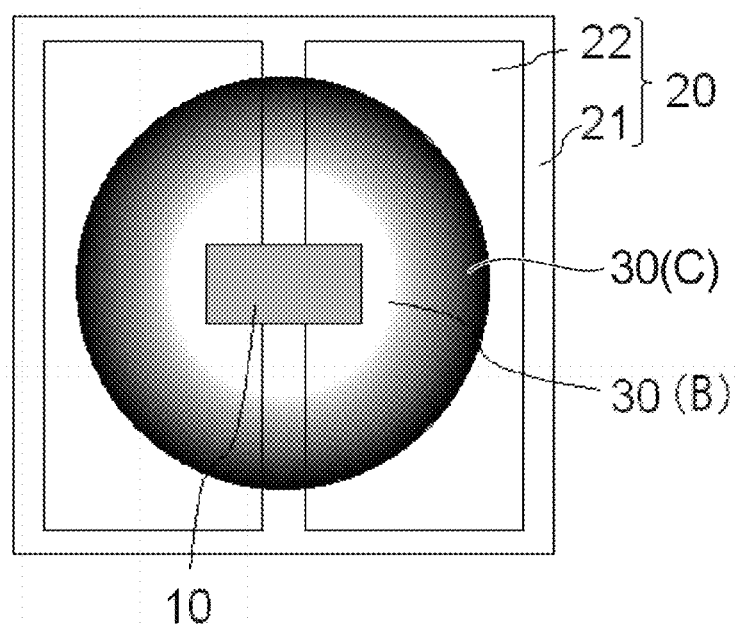
FIG. 4 is a top view of a light emitting device according to an embodiment.
Figure 5:
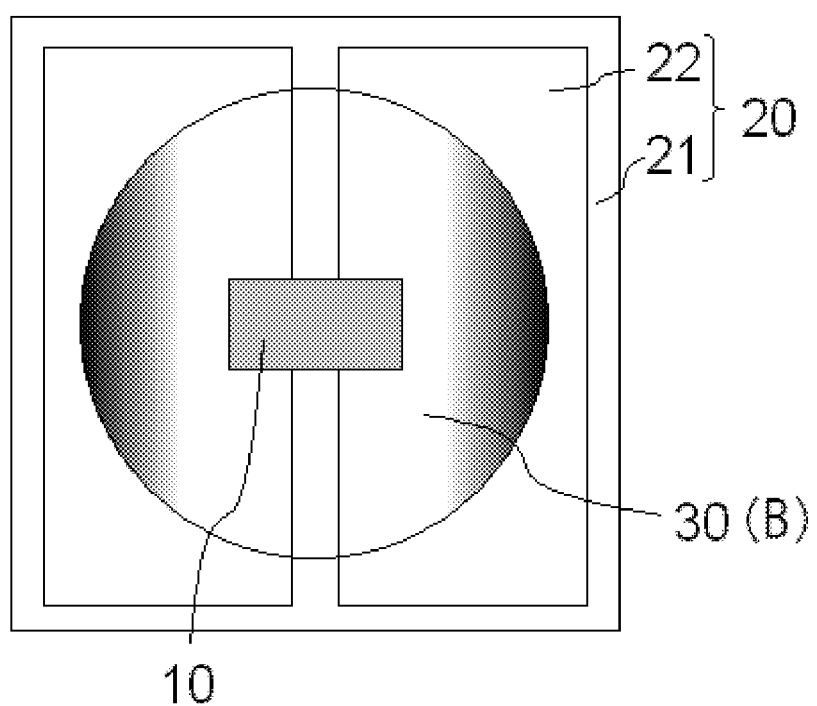
FIG. 5 is a top view of a light emitting device according to an embodiment.

FIG. 4 and FIG. 5 are top views of base bodies of light emitting devices, each of which includes a base body 20 provided with a pair of wiring conductors 22 arranged on a parent material 21, a light emitting element 10 having a rectangular contour and being connected to the wiring conductors 22 respectively, and an anisotropic conductive adhesive member 30 disposed surrounding the light emitting element 22. In each figure, the portion at an outer side than the side surfaces of the light emitting element 10 is an external region and which includes the surrounding region B. In the external region, a side (surrounding region B) close to the light emitting element includes the electrically conductive particles with a lower concentration compared to that of a side (distant region C) far from the light emitting element. In FIG. 4 and FIG. 5, the distribution state of the electrically conductive particles is shown in shading, where darker shading indicates regions of higher concentration and lighter shading indicates regions of lower concentration of the electrically conductive particles. As described above, absorption of light can be reduced by disposing the electrically conductive particles away from the light emitting element.

In addition, as shown in FIG. 5, the distant region C may include a region of low concentration of the electrically conductive particles. Also, as shown in FIG. 4, in a top view of the anisotropic conductive adhesive, the concentration of the electrically conductive particles may vary in all directions, or as shown in FIG. 5, the concentration of the electrically conductive particles may vary in a certain direction. In the figure, the concentration gradient is separated in the right and left opposite directions, but it is not limited thereto, the concentration gradient may be separated in the up and down opposite directions, or the concentration gradient may be such that the electrically conductive particles are gathered in one location. In any case, the electrically conductive particles are preferably disposed spaced apart from the light emitting element so as not to be near the light emitting element.

The external region B of the anisotropic conductive adhesive member 30 includes a fillet portion B1 crept up along the side surfaces of the light emitting element 10. The concentration of the electrically conductive particles 31 in the fillet portion B1 is higher in the lower side (e.g., lower than an emitting layer of the semiconductor light emitting element) than in the upper side. That is, a region is provided in a direction perpendicular (in a longitudinal direction) to the upper surface of the base body 20 with a different concentration of the electrically conductive particles. With this arrangement, little light emitted from the side surfaces of the light emitting element 10 may be absorbed by the electrically conductive particles 31.

As described above, the electrically conductive particles which are necessary for establishing electrical continuity are locally disposed so as not to spread into the regions unnecessary for electrical continuity. Thus, absorption of light can be reduced, and further, the amount of the electrically conductive particles 31 in the unhardened state of the anisotropic conductive adhesive can be reduced. Accordingly, for example, in the case where a fluorescent material and/or a light diffusing material etc., is mixed and dispersed in the anisotropic conductive adhesive, the whole amount of light, whose wavelength is converted, or which is reflected or scattered by them, absorbed by the electrically conductive particles can be reduced and a light emitting device having excellent light extracting efficiency can be obtained.

In order to provide electrically conductive particles with different concentrations in the anisotropic conductive adhesive member (e.g., in a parallel direction or a perpendicular direction with respect to the upper surface of the base body), the electrically conductive particles are needed to be moved before the anisotropic conductive adhesive is hardened. In this embodiment, a magnetic field generating member is arranged on the back surface side (the back surface side of the portion for mounting a light emitting element) of the base body and a magnetic field is applied to the anisotropic conductive adhesive before hardening so that the electrically conductive particles are drawn close to the light emitting element, in other words, to the base body side. Thus, a change in the concentration of the electrically conductive particles between portions near the center and portions near the periphery, and/or between the upper side and the lower side of the anisotropic conductive adhesive is obtained. In the present specification, the term "magnetic field generating member" refers to a member which can generate a magnetic field, and examples thereof include a magnet and also a coil and the like which generate a magnetic field by supplying an electric current. Hence, the expression "a magnetic field generating member is arranged to apply an magnetic field" indicates that in the case of a magnet, the magnet is moved to bring its magnetic field close to the anisotropic conductive adhesive. In the case where a coil or the like is used, electricity is applied to the coil to generate a magnetic field and then the coil is moved as in the case of a magnet to a designated position, or may be such that presence or absence of a magnetic field is controlled by applying or non-applying of electricity without involving physical movement. Once the anisotropic conductive adhesive is hardened, application of magnetic field on the anisotropic conductive adhesive may be stopped.

Hereinafter, each constructional member will be described in detail.

(Base Body)

The base body 20 includes a parent material 21 and wiring conductors 22 held by the parent material 21 and function as a pair of positive and negative electrodes, and various materials and shapes can be employed according to the number of light emitting elements to be used, the type of usage, and the like. An LED may be formed with a resin package, a glass epoxy resin package, a ceramic package, and a metal package, which are a lead-inserted type. Also, a COB (chip on board) or a COF (chip on film) type which employs a rigid substrate which lacks flexibility, a flexible substrate (bendable substrate) which has flexibility, or a rigid-flexible substrate which is a combination of them can be used. The wiring conductors each have a terminal portion so that electricity can be supplied from outside. The terminal portions can be arranged respectively on the upper surface, a side surface, or the lower surface etc., of the base body 20. In the case of COB or COF, a connector may be arranged on each terminal portion.

The shape of the base body 20 may be formed with an outline of, in a top view, a rectangle, a quadrangle, a polygon, a circle, or an oval, or further, a shape which is a combination of those. In a cross-sectional view, a base body 20 may have a planar shape as shown in FIG. 1, or a base body may have a different thickness in parts with a recess defined by a side wall portion and a bottom surface portion. The surfaces (upper surfaces of the wiring conductors) where a light emitting element to be mounted are preferably formed with an approximately the same height. Thus, after the light emitting element is mounted, a uniform loading can be applied at the time of application of pressure (thermalcompression) and thus bonding can be obtained with good reliability.

Examples of the materials used for the parent material include ceramic, resin, and glass. For example, such ceramic include aluminum nitride, alumina, and LTCC (Low Temperature Co-fired Ceramics). Examples of such a resin include a thermosetting resin and a thermoplastic resin, more specifically, an epoxy resin composition, a silicone resin composition, a modified epoxy resin composition such as a silicone-modified epoxy resin, a modified silicone resin composition such as an epoxy-modified silicone resin, a polyimide resin composition, a modified polyimide resin composition, a urethane resin, a modified urethane resin composition, Teflon (trademark), FR-4, and CEM-3. The examples further include polyethylene terephthalate (PET), polyethylene naphthalate (PEN), polyimide, liquid crystal polymers, and nylon. Such parent materials may include fine particles as a filler, such as $TiO_2$, $SiO_2$, $Al_2O_3$, MgO, $MgCO_3$, $CaCO_3$, $Mg(OH)_2$, $Ca(OH)_2$, and the like.

Preferable examples of the material for the wiring conductors 22 include C, Fe, Cu, Ni, Al, Ag, and Au, and metals containing those (alloys) and plating. In the case where a resin package is of a frame-inserted type, a plate-shape lead processed to have a predetermined shape can be used, and in addition to a flat-plate shape, a shape having partially different thickness or a shape having an upward and/or downward bending may be employed, and the thickness, shape, etc., can be variously selected according to the shape etc., of the light emitting device. Other than those described above, a base body formed by using a build-up method or a subtractive method with the use of photoresist technology, a base body formed by using printing with the use of a conductive paste, electrolytic plating, or electroless plating may also be employed.

In the case where the conductive particles in the anisotropic conductive additive to be moved, a magnetic field generating member is used as described later, but at least a part of the wiring conductors 22 arranged on the base body may be a magnetic field generating member. For example, a wiring conductor which serves as an electricity-supplying member for the light emitting element and a wiring conductor which serves as a magnetic field generating member which is provided independently of the former, the base body may be provided with the both. With this arrangement, the electrically conductive particles can be moved without using a magnetic field generating member as a separate member.

For the base body, the parent material and the wiring conductors 22 as described above are necessary components, but other members may also be additionally provided. For example, the base body may further includes an insulating covering member which covers portions of the wiring conductors 22 where the light emitting element, a protective element, and the like are not mounted. Particularly, in the case where the wiring conductors 22 tend to absorb light, a covering member having a high reflectance (for example a white resist) is applied to cover such members, and thus degradation of the light extracting efficiency can be prevented. In addition, independently of the wiring conductors 22, a metal member functions as a heat dissipating member may also be provided.

(Anisotropic Conductive Adhesive Member)

The anisotropic conductive additive member is a member for establishing electric continuity between the light emitting element and the wiring conductors of the base body, and also is a member for fixing the light emitting element to the base body. In order to exert the two functions as described above, the anisotropic conductive adhesive is a compound of a light transmissive resin as an adhesive agent and electrically conductive particles for establishing electric continuity which are mixed in the light transmissive resin.

As shown in FIG. 1, the anisotropic conductive adhesive member 30 is made of a lower portion A arranged under the light emitting element and an external portion B arranged outer side of the side surfaces of the light emitting element. Under the light emitting element 10, the lower region A of the anisotropic conductive adhesive 30 has functions of establishing a path of electrical continuity (main function) between the electrodes (not shown) of the light emitting element 10 and the wiring conductors 22 of the base body 20, where the electrically conductive particles 31 are made in contact with the electrodes of the light emitting element 10 and the wiring conductors 22 of the base body 20 by applying pressure (pressure bonding), and of fixing the light emitting element 10 to the base body 20 by hardening the light transmissive resin by way of thermocompression bonding. The surrounding region B has a function of assisting the fixing of the lower region A and the light emitting element 10 and obtaining stronger adhesion by hardening the light transmissive resin by way of thermocompression bonding. In addition, unevenly distributing the concentration of the electrically conductive particles so that the concentration of the lower region A is higher than that of the surrounding region B, in other words, concentrating the electrically conductive particles in the lower region ensuring establishing of electrical connection, and reducing the amount of the electrically conductive particles in the surrounding region allows reduction in the optical absorption.

Also, in the lower region A and the surrounding region B of the anisotropic conductive adhesive member, a part over the parent material of the base body exposed between the wiring conductors 22 includes the electrically conductive particles. Although do not contribute the electrical continuity, those electrically conductive particles have a thermoconductivity higher than that of the light transmissive resin, so that heat dissipation can be improved. Further, in the light emitting element 10, the electrodes or the like of the light emitting element are arranged to prevent light from passing from the bottom surface of the light emitting element toward the base body, but even a part of light is released in the base body direction, it can be blocked by the electrically conductive particles. With this arrangement, an optical burn-in or the like, can be prevented. Also, mixing a white filler or the like into the anisotropic conductive adhesive allows efficient reflection of such light.

Further, covering the three kinds of members, the wiring donductors which serve as a pair of electrodes and the parent material exposed between them, with the anisotropic conductive adhesive member in an integrated manner allows releasing (dispersing) of the bending stress loaded on these different members to other portions which are not covered. Particularly, in the case where the base body is a flexible substrate having a bendability, the mechanical strength of the region where the wiring conductor does not exist, that is, the region to which a light emitting element to be mounted in a flip-chip manner may be decreased. In such a case, employing an anisotropic conductive adhesive having a hardness after hardened being either equaling or surpassing the hardness compared to that of the flexible substrate, the strength against a bending can be improved.

Further, forming the surrounding region B as a region formed only with a light transmissive resin, that is, as a region where conductive particles are not present, absorption of light can be further reduced.

In addition, the external region B has a fillet portion B1 formed on the side surfaces of the light emitting element 10. The fillet portion B1 has a function of fixing the light emitting element 10 from the side, and with forming the fillet portion to cover the entire circumference of the light emitting element 10, a much stronger fixation can be created.

The concentration of the electrically conductive particles in the fillet portion is higher in the lower portion than in the upper portion, and particularly, a part of the fillet portion on the side surfaces of the light emitting element and located above the light emitting layer (i.e., active layer) is preferably made only with the light transmissive resin. With this arrangement, light released from the side surfaces of the light emitting layer in a lateral to upward directions can be prevented from absorbed by the electrically conductive particles.

The light transmissive resin constituent of the anisotropic conductive adhesive member preferably has excellent light resistance and heat resistance, and capable of allowing light from the light emitting element to easily pass through. The examples thereof include an epoxy resin composition, an silicone resin composition, a polyimide resin composition, and a modified resin or hybrid resin of those.

It is preferable that at least a part of the electrically conductive particles mixed in such a light transmissive resin are magnetic and examples thereof include nickel (Ni), iron (Fe), cobalt (Co), and stainless. Particularly, nickel, which is ferromagnetic, is preferable. The size and shape of the electrically conductive particles are not specifically limited, and for example, a spherical shape, a needle-like shape, or an irregular shape may be employed, and a size of about 1 μm to 20 μm is preferable, and about 2 μm to 10 μm is further preferable. The content of the electrically conductive particles in the light transmissive resin is preferably 10 wt % or less, and more preferably 1 wt % or less.

In addition to the electrically conductive particles, a filler which is insulating and has a high reflectance, a fluorescent material for converting the wavelength (a wavelength converting member), and the like may also be contained. For the filler having a high reflectance, $TiO_2$, $SiO_2$, $Al_2O_3$, MgO, $MgCO_3$, $CaCO_3$, $Mg(OH)_2$, $Ca(OH)_2$ etc., can be used. For the fluorescent material, the fluorescent materials to be exemplified later in the description of sealing material can be used. However, in the case where the particle size of the filler and the fluorescent material are the same as or greater than that of the electrically conductive particles, electrical connection cannot be established. The particle diameter of the filler and the fluorescent material is preferably 1/10 or less, and further 1/100 or less compared to that of the electrically conductive particles.

(Sealing Member)

After curing the anisotropic conductive adhesive to fix the light emitting element on the base body, a sealing member is preferably disposed to cover the light emitting element and the anisotropic conductive adhesive member. Accordingly, they can be protected from dust and moisture, and further from an external force or the like. The material of the sealing member preferably has optical transmissivity which allows the light from the light emitting element to transmit therethrough, and also has light resistance against deterioration by such light.

The sealing member is disposed to at least cover the light emitting element, and it is not necessary to cover the entire portion of the anisotropic conductive adhesive member disposed beneath the light emitting element. For example, in the case where a wavelength converting member is mixed in the sealing member, it is preferable that a filler having a white color or the like is preliminarily mixed in the anisotropic conductive adhesive member, and the sealing member is disposed with an area equal to or smaller than that of the anisotropic conductive adhesive member. In other words, the anisotropic conductive adhesive member is preferably disposed with an area wider (greater) than that of the sealing member. With this arrangement, light from the wavelength converting member in the sealing member can be easily reflected upward by the anisotropic conductive adhesive member.

The shape of the outer surface of the sealing member can be selected variously according to the light distribution characteristics or the like. For example, in FIG. 1, the upper surface of the sealing member 40 has a convex lens shape, but other shapes such as a concave lens shape, a Fresnel lens shape, or the like can be employed, and the directional characteristics can be adjusted according to the shape. The sealing member can be disposed by using potting (dripping) technique, compression molding technique, printing technique, transfer molding technique, jet-dispensing technique, or the like. Also, the sealing member may be arranged to be hollow, for example, a dome-shaped light transmissive covering member may be overlaid and fixed.

Specific example of the material for the sealing member include a resin and glass, and in detail include, an insulating resin composition having light transmissive property which allows light from a light emitting element to pass through, such as transmitting a silicone resin composition, a modified silicone resin composition, a modified epoxy resin composition, and a fluororesin composition. Particularly, a hybrid resin containing one or more resins having a siloxane skeleton such as a dimethyl silicone resin, a phenyl silicone resin having a low content of phenyl groups, and a fluorinated-silicone resin is more preferably used. These resins preferably has a JIS-A hardness of 10 or more and a JIS-D hardness of 90 or less. More preferably has a JIS-A hardness of 40 or more and a JIS-D hardness of 70 or less.

In addition to these light transmissive materials, a coloring agent, a light diffusing agent, a light reflecting material, various fillers, a wavelength converting member (a fluorescent material) or the like can also be contained in the sealing member as required. The wavelength converting member is not specifically limited as long as it can absorb light from the light emitting element and convert it into light of a different wavelength. Examples thereof include at least one material selected from the group consisting of a nitride-based fluorescent material, an oxynitride-based fluorescent material, and a sialon-based fluorescent material which are mainly activated with a lanthanoid element such as Eu or Ce; an alkaline-earth halogen apatite fluorescent material, an alkaline-earth metal borate halogen fluorescent material, an alkaline-earth metal aluminate fluorescent material, an alkaline-earth silicate fluorescent material, an alkaline-earth sulfide fluorescent material, an alkaline-earth thiogallate fluorescent material, an alkaline-earth silicon nitride fluorescent material, and a germinate which are mainly activated with a lanthanoid element such as Eu and/or a transition-metal element such as Mn; a rare earth aluminate fluorescent material and a rare earth silicate fluorescent material which are mainly activated with a lanthanoide element such as Ce; and an organic material and organic complex which are mainly activated with a lanthanoid element such as Eu. Specific examples thereof include $(Y,Gd)_3(Al,Ga)_5O_{12}$:Ce, $(Ca,Sr,Ba)_2SiO_4$:Eu, $(Ca,Sr)_2Si_5N_8$:Eu, and $CaAlSiN_3$:Eu.

(Semiconductor Light Emitting Element)

The semiconductor light emitting element is flip-chip mounted via the anisotropic conductive adhesive. A pair of positive and negative electrodes are disposed on the same surface side of the semiconductor layer, and a metal which can reflect light from the light emitting element is used for the electrodes. For example, a structure is obtained in which releasing of light from the light emitting element (light emitting layer) from the underside of the light emitting element (light emitting layer) can be avoided by disposing the electrodes having a high reflectance such as silver (Ag). The electrically conductive particles in the anisotropic conductive adhesive are located directly under the light emitting element, but disposing the electrodes as described above can prevent absorption of light by the electrically conductive particles. For the electrodes, stacked layers of metals other than silver described above can be used.

The semiconductor light emitting element of any appropriate wavelength can be employed. For example, for the light emitting element to emit blue or green light, ZnSe, a nitride-based semiconductor ($In_XAl_YGa_{1-X-Y}N$, $0≤X$, $0≤Y$, $X+Y≤1$), or GaP may be employed. For the light emitting element to emit red light, GaAlAs, AlInGaP, or the like may be employed. A semiconductor light emitting element made of a material other than the above may also be employed. The composition, color of emitted light, size and number of the light emitting element to be used can be selected appropriately according to the purpose. In the case of forming a light emitting device having a fluorescent material, a nitride semiconductor which can emit light of a shorter wavelength which can efficiently excite the fluorescent material is suitably exemplified. The emission wavelength can be variously selected by the materials and the content ratio of the mixed crystal of the semiconductor layer. A light emitting element to emit ultraviolet light or infrared light can also be employed as well as a light emitting element to emit visible light. Further, a light receiving element or the like can be mounted in addition to the light emitting element.

(Method of Manufacturing)

Figure 2A:
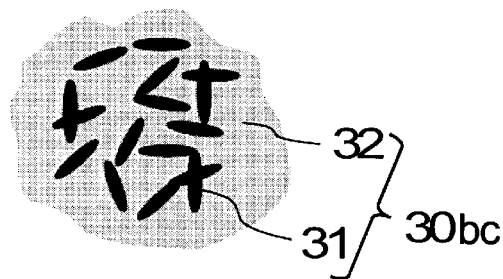
FIG. 2A is a schematic diagram illustrating an anisotropic conductive adhesive.
Figure 2B:
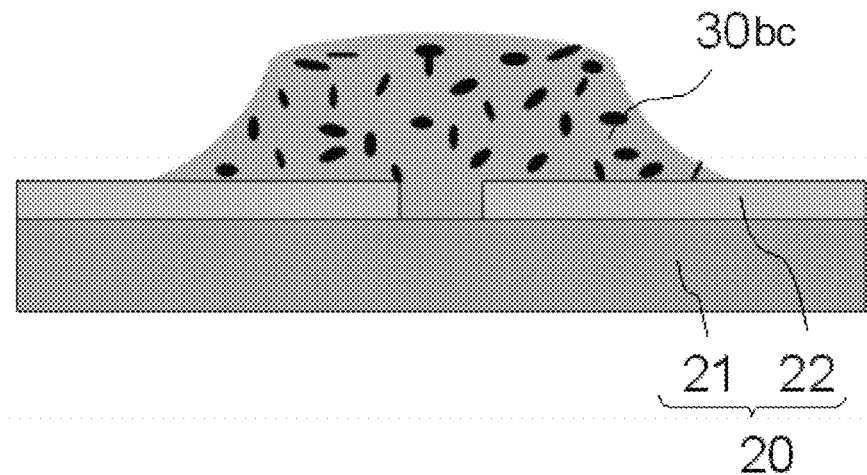
FIG. 2B is a diagram illustrating a method of manufacturing a light emitting device according to an embodiment.
Figure 2C:
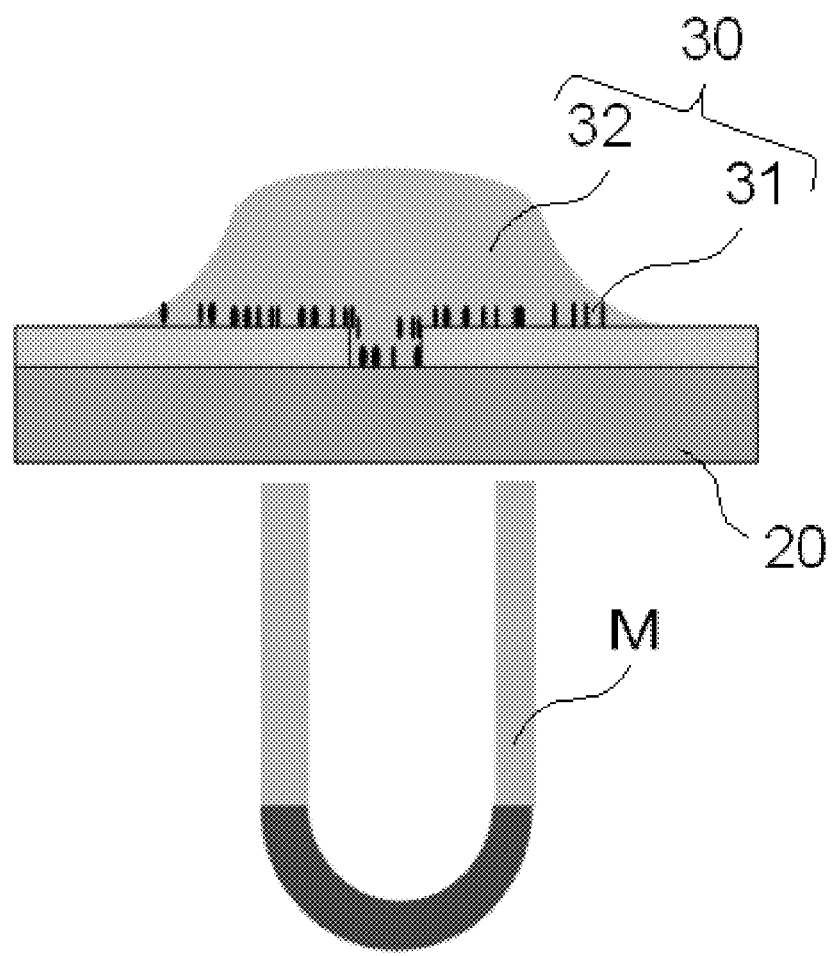
FIG. 2C is a diagram illustrating a method of manufacturing a light emitting device according to an embodiment.
Figure 2D:
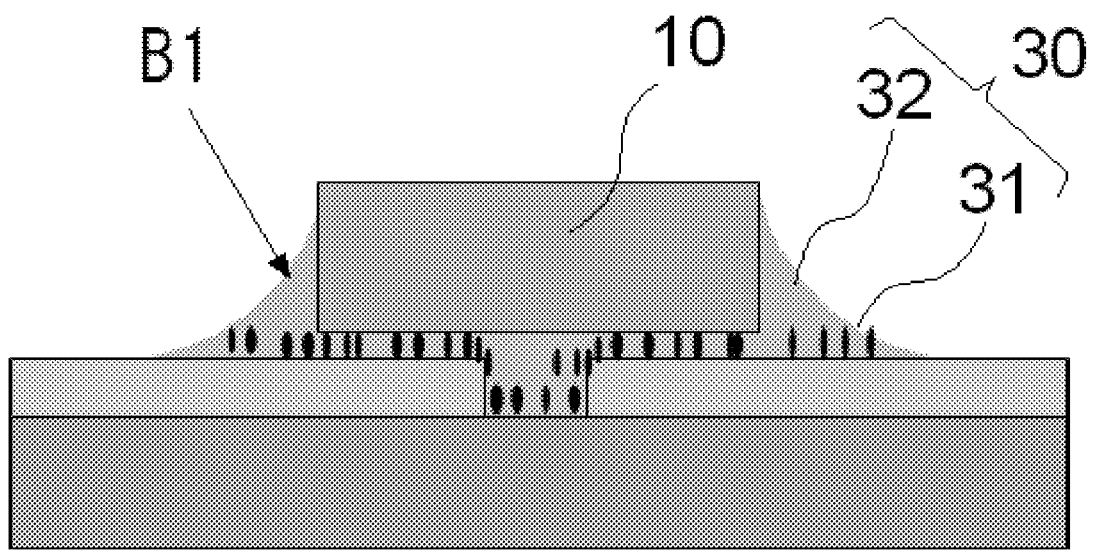
FIG. 2D is a diagram illustrating a method of manufacturing a light emitting device according to an embodiment.

FIG. 2A is a schematic diagram illustrating the anisotropic conductive adhesive, and FIG. 2B to FIG. 2D are diagrams illustrating a step for obtaining a light emitting device of the present embodiment. In detail FIG. 2A shows the anisotropic conductive adhesive having the electrically conductive particles 31 mixed in the light transmissive resin 32. At this time which is prior to curing, the electrically conductive particles 31 are sustained approximately uniformly dispersed in the light transmissive resin 32. Next, as shown in FIG. 2B, the base body 20 is prepared and the anisotropic conductive adhesive 30bc is disposed to continuously cover the three portions; a pair of wiring conductors 22 disposed on the base body 20 and the parent material 21 disposed between the pair of the wiring conductors 22. For the method of disposing the anisotropic conductive adhesive 30bc, printing, dispensing, or the like, can be used. At this time, the anisotropic conductive adhesive is disposed in a larger area than the area of the light emitting element to be mounted in later step.

Next, a magnetic field is applied around the anisotropic conductive adhesive 30bc to attract the electrically conductive particles 31 to the base body 20 side. In FIG. 2C, for easy understanding, a U-shape magnet M, which is a magnetic field generating member, is placed at an underside of the base body 20 to attract the electrically conductive particles 31. The material for the anisotropic conductive adhesive is not limited by the type and shape of the magnet as long as it can generate a magnetic field, a magnetic field of approximately equal intensity is preferably applied on the wiring conductors 22 to be served as electrodes, so that a uniform amount can be attracted at both the positive and negative sides.

In this state, that is, before curing the light transmissive resin 32 and the electrically conductive particles 31 are locally disposed at the base body side 20, the light emitting element 10 is mounted on the anisotropic conductive adhesive 30bc. At this time, the fillet portion B1 of the anisotropic conductive adhesive 30bc is formed on the side surfaces of the light emitting element 10. Then, while applying the magnetic field or after stopping the magnetic field, heat and pressure are applied downwardly from above the light emitting element to harden the light transmissive resin. Through the steps as described above, as shown in FIG. 2D, the anisotropic conductive adhesive 30bc can be hardened with the electrically conductive particles 31 therein are locally distributed at the base body 20 side. That is, the light emitting element is bonded by the anisotropic conductive adhesive member 30 having the fillet portion B1 in which the concentration of the electrically conductive particles is higher in its lower portion than that in its upper portion. With this arrangement, light emitted from the side surfaces of the light emitting element can be prevented from being absorbed by the electrically conductive particles. Further, the amount of the electrically conductive particles can be reduced, so that the entire amount of light absorbed by the electrically conductive particles, for example, light from the fluorescent material and a light diffusing material which are diffusively mixed in the anisotropic conductive adhesive member 30, can be reduced.

Figure 3A:
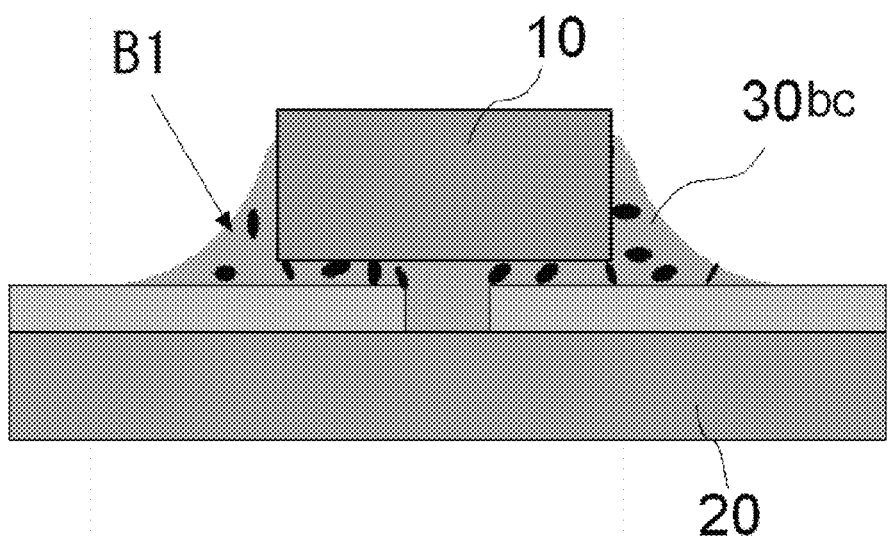
FIG. 3A is a diagram illustrating a method of manufacturing a light emitting device according to an embodiment.
Figure 3B:
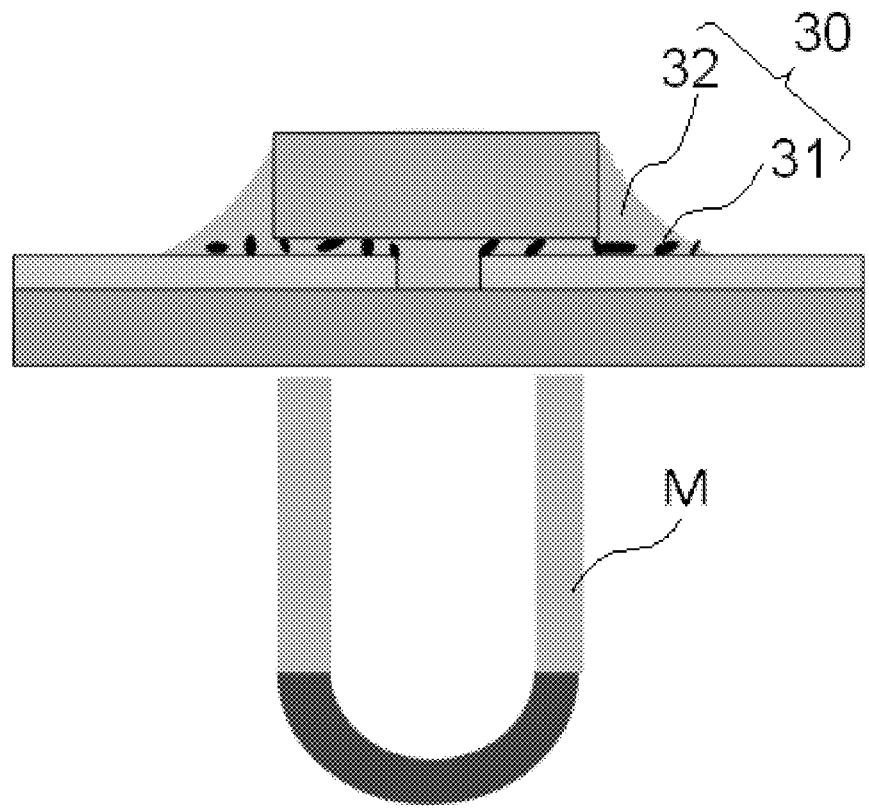
FIG. 3B is a diagram illustrating a method of manufacturing a light emitting device according to an embodiment.

FIG. 3A and FIG. 3B are diagrams each respectively illustrating a step in the steps shown in FIG. 2A to FIG. 2D, a step of moving the electrically conductive particles in the anisotropic conductive adhesive 30bc to the base body side, and a step of mounting the light emitting element 10 are performed in a reverse order. As shown in FIG. 3A, after disposing the anisotropic conductive adhesive 30bc on the base body 20 and before moving the electrically conductive particles to the base body side, the light emitting element 10 is disposed. At this time, the inner side of the fillet portion B1 of the anisotropic conductive adhesive 30bc is in a state where the electrically conductive particles are uniformly dispersed.

Next, as shown in FIG. 3B, the magnetic field generating member M is disposed under the base body 20 and the electrically conductive particles 31 in the fillet portion B1 of the anisotropic conductive adhesive 30bc are moved to the base body 20 side. With this arrangement, the concentration of the electrically conductive particles 31 in the fillet portion B1 can be arranged higher in the lower side (base bode side) than in the upper portion.

As described above, in the case where the electrically conductive particles are moved after mounting the light emitting element, as shown in FIG. 6, arranging a magnetic field generating member M at a position outside of the surrounding region B of the anisotropic conductive adhesive 30 allows moving of the electrically conductive particles away from the light emitting element as shown in FIG. 4.

INDUSTRIAL APPLICABILITY

The light emitting devices according to the present embodiment can be utilized in applications such as various indicators, lighting apparatus, displays, backlight light sources for liquid crystal displays, and further, digital video cameras, facsimiles, copiers, image reading systems in scanners or the like, and projector devices.

It is to be understood that although the present embodiment has been described with regard to preferred embodiments thereof, various other embodiments and variants may occur to those skilled in the art, which are within the scope and spirit of the embodiment, and such other embodiments and variants are intended to be covered by the following claims.

What is claimed is:

1. A light emitting device comprising:
   a base body having wiring conductors;
   a conductive adhesive member comprising electrically conductive particles mixed in a light transmissive resin; and
   a semiconductor light emitting element bonded on the wiring conductors via the conductive adhesive;
   wherein the conductive adhesive member comprises the electrically conductive particles with a concentration lower in a surrounding region around the semiconductor light emitting element than in a lower region located between the semiconductor light emitting element and the base body.

2. The light emitting device according to claim 1, wherein the conductive adhesive member in the surrounding region covers side surfaces of the semiconductor light emitting element and forms a fillet portion.

3. The light emitting device according to claim 2, wherein the electrically conductive particles are included in the conductive adhesive member in an upper side portion of the fillet portion with a concentration lower than the concentration of electrically conductive particles included in a lower side portion of the fillet portion of the conductive adhesive member.

4. The light emitting device according to claim 3, wherein in the fillet portion, the conductive adhesive member in the upper side potion is substantially formed with the light transmissive resin.

5. The light emitting device according to claim 1, wherein the conductive adhesive member is arranged to form a spacing region containing the electrically conductive particles with a concentration further higher than the surrounding region, around the surrounding region.

6. The light emitting device according to claim 1, wherein the electrically conductive particles are magnetic bodies.

7. The light emitting device according to claim 1, wherein the content of the electrically conductive particles in the conductive adhesive member is 1 wt % or less.

8. The light emitting device according to claim 1, wherein the wiring conductors are at least in part made of a magnet field generating member.

9. The light emitting device according to claim 1, further comprising a sealing member covering the conductive adhesive member and the semiconductor light emitting element.

10. The light emitting device according to claim 1, wherein the conductive adhesive member is an anisotropic conductive adhesive member.

11. The light emitting device according to claim 1, wherein the light emitting device is produced by a method comprising the steps of:
providing a base body having wiring conductors;
providing a conductive adhesive member comprising electrically conductive particles substantially uniformly dispersed in a light transmissive resin on at least the wiring conductors of the base body;
mounting a semiconductor light emitting element on the wiring conductors via the conductive adhesive;
moving the electrically conductive particles in the conductive adhesive member so as to provide the conductive adhesive member with a concentration of the electrically conductive particles lower in a surrounding region around the semiconductor light emitting element than in a lower region located between the semiconductor light emitting element and the base body; and then
hardening the light transmissive resin.

12. The light emitting device according to claim 11, wherein the step of moving the electrically conductive particles comprises applying a magnetic field to attract the electrically conductive particles to the lower region located between the semiconductor light emitting element and the base body.

13. The light emitting device according to claim 12, wherein the step of moving the electrically conductive particles is carried out before the step of mounting the semiconductor light emitting element on the wiring conductors via the conductive adhesive.

14. The light emitting device according to claim 12, wherein the step of moving the electrically conductive particles is carried out after the step of mounting the semiconductor light emitting element on the wiring conductors via the conductive adhesive.

15. The light emitting device according to claim 11, wherein the step of moving the electrically conductive particles is carried out before the step of mounting the semiconductor light emitting element on the wiring conductors via the conductive adhesive.

16. The light emitting device according to claim 11, wherein the step of moving the electrically conductive particles is carried out after the step of mounting the semiconductor light emitting element on the wiring conductors via the conductive adhesive.

17. The light emitting device according to claim 11, wherein the step of providing a conductive adhesive member comprises providing the conductive adhesive in a larger area than an area in which the light emitting element is mounted.

18. The light emitting device according to claim 17, wherein during the step of mounting the semiconductor light emitting element on the wiring conductors via the conductive adhesive forms a fillet portion of the conductive adhesive on side surfaces of the light emitting element.

19. The light emitting device according to claim 18, wherein the step of moving the electrically conductive particles moves the electrically conductive particles in the fillet portion such that the electrically conductive particles are included in the conductive adhesive member in an upper side portion of the fillet portion with a concentration lower than the concentration of electrically conductive particles included in a lower side portion of the fillet portion of the conductive adhesive member.

20. The light emitting device according to claim 19, wherein the step of moving the electrically conductive particles moves the electrically conductive particles in the fillet portion such that the conductive adhesive member in the upper side potion is substantially formed only with the light transmissive resin.

21. The light emitting device according to claim 11, wherein the step of moving the electrically conductive particles moves the electrically conductive particles to form a spacing region containing the electrically conductive particles with a concentration further higher than the surrounding region, around the surrounding region.

22. The light emitting device according to claim 11, wherein the electrically conductive particles are magnetic bodies.

23. The light emitting device according to claim 11, wherein the content of the electrically conductive particles in the conductive adhesive member is 1 wt % or less.

24. The light emitting device according to claim 11, wherein the wiring conductors are at least in part made of a magnet field generating member.

25. The light emitting device according to claim 11, further comprising providing a sealing member covering the conductive adhesive member and the semiconductor light emitting element.

26. The light emitting device according to claim 11, wherein the conductive adhesive member is an anisotropic conductive adhesive member.

* * * * *